United States Patent
Liu et al.

(10) Patent No.: US 10,649,289 B2
(45) Date of Patent: May 12, 2020

(54) ARRAY SUBSTRATE, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Sha Liu, Beijing (CN); Zhaokun Yang, Beijing (CN); Xiang Feng, Beijing (CN); Qiang Zhang, Beijing (CN); Xiao Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 117 days.

(21) Appl. No.: 15/767,878

(22) PCT Filed: Sep. 28, 2017

(86) PCT No.: PCT/CN2017/103945
§ 371 (c)(1),
(2) Date: Apr. 12, 2018

(87) PCT Pub. No.: WO2018/149144
PCT Pub. Date: Aug. 23, 2018

(65) Prior Publication Data
US 2019/0094637 A1 Mar. 28, 2019

(30) Foreign Application Priority Data
Feb. 16, 2017 (CN) .......................... 2017 1 0084176

(51) Int. Cl.
*G02F 1/1362* (2006.01)
*G02F 1/1343* (2006.01)
(Continued)

(52) U.S. Cl.
CPC .... *G02F 1/136213* (2013.01); *G02F 1/13452* (2013.01); *G02F 1/134336* (2013.01);
(Continued)

(58) Field of Classification Search
CPC ...................................................... H01L 27/124
See application file for complete search history.

(56) References Cited

U.S. PATENT DOCUMENTS

| | | | |
|---|---|---|---|
| 2012/0098816 A1* | 4/2012 | Lee ...................... | G09G 3/3648 345/212 |
| 2016/0037054 A1 | 2/2016 | Moriya et al. | |
| 2016/0363830 A1* | 12/2016 | Chen .................... | G09G 3/3648 |

FOREIGN PATENT DOCUMENTS

| | | |
|---|---|---|
| CN | 104317127 A | 1/2015 |
| CN | 105742295 A | 7/2016 |
| CN | 106684102 A | 5/2017 |

OTHER PUBLICATIONS

International Search Report and Written Opinion for Application No. PCT/CN2017/103945, dated Dec. 21, 2017, 13 Pages.

* cited by examiner

*Primary Examiner* — Raj R Gupta
(74) *Attorney, Agent, or Firm* — Brooks Kushman P.C.

(57) ABSTRACT

An array substrate, a display panel and a display device are provided. The array substrate includes a plurality of signal lines each connected to a plurality of subpixel units. The plurality of signal lines includes first signal lines. The plurality of subpixel units connected to each first signal line is divided into at least two groups each including at least one subpixel unit. An overlapping area between a common electrode and a pixel electrode of each subpixel unit in the group of subpixel units adjacent to a signal input end of the first signal line is larger than an overlapping area between a common electrode and a pixel electrode of each subpixel (Continued)

unit in the group of subpixel units away from the signal input end of the first signal line.

13 Claims, 8 Drawing Sheets

(51) Int. Cl.
*G02F 1/1345* (2006.01)
*H01L 27/12* (2006.01)
*G02F 1/1368* (2006.01)

(52) U.S. Cl.
CPC ...... *G02F 1/136286* (2013.01); *H01L 27/124* (2013.01); *H01L 27/1255* (2013.01); *G02F 1/1368* (2013.01); *G02F 2001/134345* (2013.01); *G02F 2001/134372* (2013.01); *G02F 2201/121* (2013.01); *G02F 2201/122* (2013.01); *G02F 2201/123* (2013.01)

ARRAY SUBSTRATE, DISPLAY PANEL AND DISPLAY DEVICE

CROSS-REFERENCE TO RELATED APPLICATIONS

This application is the U.S. national phase of PCT Application No. PCT/CN2017/103945 filed on Sep. 28, 2017, which claims priority to Chinese Patent Application No. 201710084176.3 filed on Feb. 16, 2017, which are incorporated herein by reference in their entireties.

TECHNICAL FIELD

The present disclosure relates to the field of display technology, in particular to an array substrate, a display panel and a display device.

BACKGROUND

Along with the development of the market, there is a trend to provide a display product with a large size and a super high resolution. However, for this display product, such a phenomenon as signal attenuation becomes more serious, i.e., a charging time period for a subpixel unit adjacent to a signal input end is different from that for a subpixel unit away from the signal input end. As a result, the subpixel units on a display panel may be charged unevenly, and thereby a display effect may be adversely affected.

SUMMARY

An object of the present disclosure is to provide an array substrate, a display panel and a display device, so as to solve the problem in the related art where the subpixel units on the display panel are charged unevenly and the display effect is adversely affected.

In one aspect, the present disclosure provides in some embodiments an array substrate, including a plurality of signal lines each connected to a plurality of subpixel units. The plurality of signal lines includes first signal lines. The plurality of subpixel units connected to each first signal line is divided into at least two groups. Each group includes at least one subpixel unit. An overlapping area between a common electrode and a pixel electrode of each subpixel unit in the group of subpixel units adjacent to a signal input end of the first signal line is larger than an overlapping area between a common electrode and a pixel electrode of each subpixel unit in the group of subpixel units away from the signal input end of the first signal line.

In a possible embodiment of the present disclosure, the signal lines are at least one of gate lines or data lines.

In a possible embodiment of the present disclosure, the at least two groups of subpixel units corresponding to the first signal line comprise a first group of subpixel units arranged adjacent to the signal input end of the first signal line and a second group of subpixel units arranged away from the signal input end of the first signal line. Each subpixel unit in the first group of subpixel units includes a transparent pixel electrode and a transparent common electrode arranged at a layer different from the pixel electrode, and a storage capacitor is formed between the pixel electrode and the common electrode of the subpixel unit in the first group of subpixel units. Each subpixel unit in the second group of subpixel units includes a transparent pixel electrode, a transparent common electrode arranged at a layer same as the pixel electrode and a nontransparent common electrode line arranged at a layer different from the pixel electrode, and a storage capacitor is formed between the pixel electrode and the common electrode line of the subpixel unit in the second group of subpixel units.

In a possible embodiment of the present disclosure, the common electrode of each subpixel unit in the first group of subpixel units is of a plate-like shape, the pixel electrode of each subpixel unit in the first group of subpixel units is of a comb-like shape, and the pixel electrode and the common electrode of each subpixel unit in the second group of subpixel units are each of a comb-like shape, and the pixel electrode of the subpixel unit in the second group of subpixel units interdigitates with the common electrode of the subpixel unit in the second group of subpixel units by a distance.

In a possible embodiment of the present disclosure, each subpixel unit in the at least two groups of subpixel units corresponding to each first signal line comprises a transparent pixel electrode and a transparent common electrode arranged at a layer different from the transparent pixel electrode, the pixel electrodes of the subpixel units in the at least two groups of subpixel units have a same size, and sizes of the common electrodes of the subpixel units in the at least two groups of subpixel units gradually decrease in a direction away from the signal input end of the first signal line.

In a possible embodiment of the present disclosure, the at least two groups of subpixel units corresponding to each first signal line comprises a first group of subpixel units arranged adjacent to the signal input end of the first signal line and a second group of subpixel units arranged away from the signal input end of the first signal line, the common electrode of the subpixel unit in the first group of subpixel units is of a plate-like shape, and the pixel electrode of each subpixel unit in the second group of subpixel units is of a comb-like shape.

In a possible embodiment of the present disclosure, the array substrate further includes a base substrate on which the plurality of signal lines is arranged.

In a possible embodiment of the present disclosure, the overlapping area between the common electrode and the pixel electrode of each subpixel unit in the group of subpixel units adjacent to the signal input end of the first signal line is an overlapping area between the common electrode and the pixel electrode of each subpixel unit in the group of subpixel units adjacent to the signal input end of the first signal line projected in a direction perpendicular to the base substrate, and the overlapping area between the common electrode and the pixel electrode of each subpixel unit in the group of subpixel units away from the signal input end of the first signal line is an overlapping area between the common electrode and the pixel electrode of each subpixel unit in the group of subpixel units away from the signal input end of the first signal line projected in the direction perpendicular to the base substrate.

In another aspect, the present disclosure provides in some embodiments a display panel including the above-mentioned array substrate.

In yet another aspect, the present disclosure provides in some embodiments a display device including the above-mentioned array substrate and a driving unit connected to signal input ends of signal lines on the array substrate.

In a possible embodiment of the present disclosure, the signal lines are gate lines or data lines, and the driving unit is arranged at one side or two opposite sides of the array substrate. A plurality of subpixel units connected to each first signal line is divided into at least two groups of subpixel units, and overlapping areas between common electrodes and pixel electrodes of the subpixel units gradually decrease in a direction away from the driving unit.

In a possible embodiment of the present disclosure, the signal lines include gate lines and data lines, and the driving unit includes a gate driving unit arranged at two opposite sides of the array substrate and a source driving unit arranged at two other opposite sides of the array substrate. A plurality of subpixel units connected to each first signal line is divided into at least two groups of subpixel units, and an overlapping area between a common electrode and a pixel electrode of each subpixel unit at a middle region of the array substrate is smaller than an overlapping area between a common electrode and a pixel electrode of each subpixel unit at a peripheral region of the array substrate.

In still yet another aspect, the present disclosure provides in some embodiments an array substrate including a plurality of signal lines each connected to a plurality of subpixel units. The plurality of signal lines includes first signal lines. The plurality of subpixel units connected to each first signal line is divided into at least two groups each including at least one subpixel unit. A capacitance of a storage capacitor formed by a common electrode and a pixel electrode of each subpixel unit in the group of subpixel units adjacent to a signal input end of the first signal line is larger than a capacitance of a storage capacitor formed by a common electrode and a pixel electrode of each subpixel unit in the group of subpixel units away from the signal input end of the first signal line.

In a possible embodiment of the present disclosure, the at least two groups of subpixel units of each first signal line include a first group of subpixel units arranged adjacent to the signal input end of the first signal line and a second group of subpixel units arranged away from the signal input end of the first signal line. Each subpixel unit in the first group of subpixel units includes a transparent pixel electrode and a transparent common electrode arranged at a layer different from the pixel electrode, and a first storage capacitor is formed by the pixel electrode and the common electrode of each subpixel unit in the first group of subpixel units. Each subpixel unit in the second group of subpixel units includes a transparent pixel electrode, a transparent common electrode arranged at a layer same as the pixel electrode and a nontransparent common electrode line arranged at a layer different from the pixel electrode, a second storage capacitor is formed by the pixel electrode and the common electrode line of each subpixel unit in the second group of subpixel units, and the first storage capacitor has a capacitance greater than that of the second storage capacitor.

DETAILED DESCRIPTION

Figure 1:
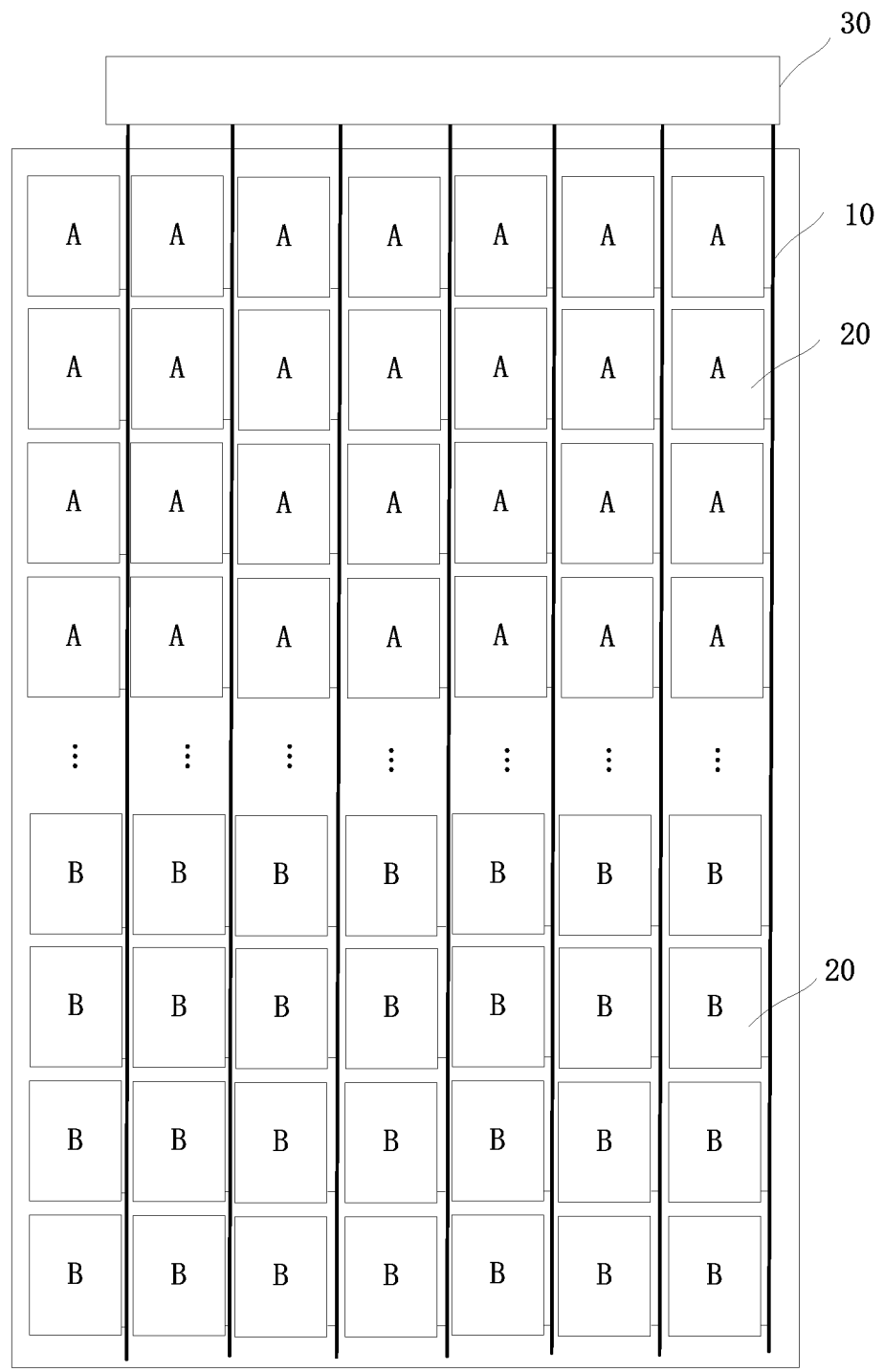
FIG. 1 is a schematic view showing an array substrate according to a first embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments an array substrate including a plurality of signal lines, each signal line is connected to a plurality of subpixel units. The plurality of signal lines includes first signal lines. The plurality of subpixel units connected to each first signal line is divided into at least two groups, each group includes at least one subpixel unit. An overlapping area between a common electrode and a pixel electrode of each subpixel unit in the group of subpixel units adjacent to a signal input end of the first signal line is larger than an overlapping area between a common electrode and a pixel electrode of each subpixel unit in the group of subpixel units away from the signal input end of the first signal line.

Signal attenuation occurring for the subpixel units adjacent to the signal input end is relatively small, so these subpixel units may actually be charged for a long time period. In the embodiments of the present disclosure, a large overlapping area is set between the common electrode and the pixel electrode of each subpixel unit adjacent to the signal input end, so as to form a storage capacitor with a large capacitance. In addition, signal attenuation occurring for the subpixel units away from the signal input end is relatively large, so these subpixel units may actually be charged for a short time period. In the embodiments of the present disclosure, a small overlapping area is set between the common electrode and the pixel electrode of each subpixel unit away from the signal input end, so as to form a storage capacitor with a small capacitance. As a result, it is able to solve the problem in the related art where it is difficult to charge a large-size display panel in an even manner.

In a possible embodiment of the present disclosure, the signal lines may include data lines, gate lines or both.

In a possible embodiment of the present disclosure, all the signal lines on the array substrate are the first signal lines, i.e., the subpixel units connected to the signal lines are divided into groups, and the overlapping area between the common electrode and the pixel electrode of each subpixel unit in the group of subpixel units adjacent to the signal input end is larger than the overlapping area between the common electrode and the pixel electrode of each subpixel unit in the group of subpixel units away from the signal input end. Of course, parts of the signal lines on the array substrate may be set as the first signal lines, and the above-mentioned grouping mode may be used. At this time, for the other signal lines, a known mode may be used, i.e., the common electrodes of the subpixel units connected to a same signal line are of a same structure, the pixel electrodes thereof are of a same structure, and the overlapping areas between the common electrodes and the corresponding pixel electrodes are same to each other.

In a possible embodiment of the present disclosure, the subpixel units connected to the first signal lines are grouped in a same mode, i.e., the subpixel units connected to each first signal line are divided into a same number of groups, the common electrodes of the subpixel units in the groups have a same structure, and the pixel electrodes of the subpixel units in the groups have a same structure.

In the embodiments of the present disclosure, the subpixel units connected to each first signal line are divided into at least two groups. It should be appreciated that, the more the groups are, the evener the charging effect is. Of course, the more the groups are, the higher the cost is.

In the embodiments of the present disclosure, in the at least two groups of subpixel units connected to each first signal line, the number of the subpixel units in each group may be same as, or different from, the number of the subpixel units in the other group.

The present disclosure will be described hereinafter in conjunction with the drawings and embodiments.

First Embodiment

As shown in FIG. 1, the array substrate includes a plurality of data lines 10, each data line 10 is connected to a plurality of subpixel units 20. The plurality of subpixel units 20 connected to each data line 10 is divided into two groups (in FIG. 1, the subpixel units A connected to the data line 10 belong to one group, and the subpixel units B connected to the data line 10 belong to another group), and each group includes a plurality of subpixel units 20. An overlapping area between a common electrode and a pixel electrode of each subpixel unit 20 (i.e., subpixel unit A) in the group of subpixel units adjacent to a signal input end of the data line 10 is larger than an overlapping area between a common electrode and a pixel electrode of each subpixel unit 20 (i.e., subpixel unit B) in the group of subpixel units away from the signal input end of the data line 10.

In this embodiment, a source driver 30 is arranged at a side of the array substrate, the plurality of data lines 10 is connected to the source driver 30, and a signal input end of the data lines 10 is arranged adjacent to the source driver 30. Each data line 10 is connected to a pixel electrode of the corresponding subpixel unit 20 via a source electrode of a TFT corresponding to the subpixel unit 20.

The signal attenuation occurring for the subpixel units A adjacent to the signal input end of the data line 10 is relatively small, so these subpixel units A may actually be charged for a long time period. In the embodiments of the present disclosure, a large overlapping area is set between the common electrode and the pixel electrode of each subpixel unit A adjacent to the signal input end, so as to form a storage capacitor with a large capacitance. In addition, the signal attenuation occurring for the subpixel units B away from the signal input end of the data line 10 is relatively large, so these subpixel units B may actually be charged for a short time period. In the embodiments of the present disclosure, a small overlapping area is provided between the common electrode and the pixel electrode of each subpixel unit B away from the signal input end, so as to form a storage capacitor with a small capacitance. As a result, it is able to solve the problem in the related art where it is difficult to charge a large-size display panel in an even manner.

Second Embodiment

Figure 2:
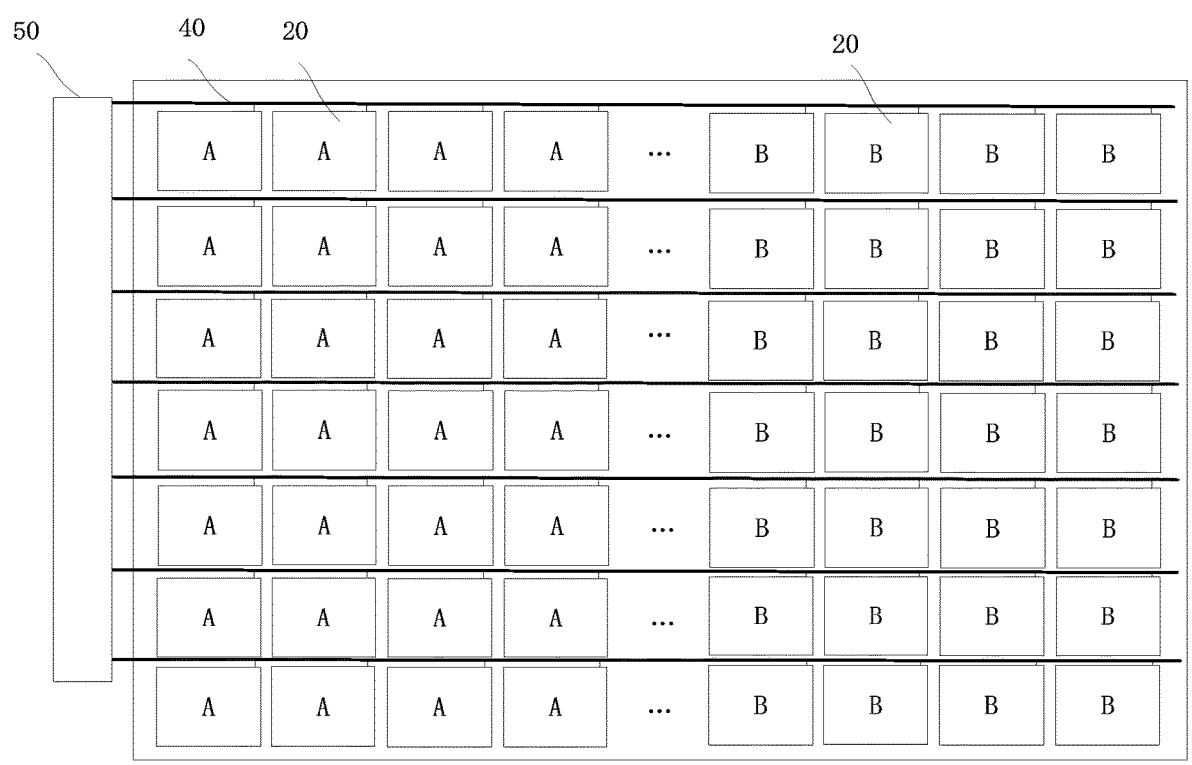
FIG. 2 is a schematic view showing an array substrate according to a second embodiment of the present disclosure.

As shown in FIG. 2, the array substrate includes a plurality of gate lines 40, each gate line 40 is connected to a plurality of subpixel units 20. The plurality of subpixel units 20 connected to each gate line 40 is divided into two groups (in FIG. 2, the subpixel units A connected to the gate line 40 belong to one group, and the subpixel units B connected to the gate line 40 belong to another group), and each group includes a plurality of subpixel units 20. An overlapping area between a common electrode and a pixel electrode of each subpixel unit 20 (i.e., subpixel unit A) in the group of subpixel units adjacent to a signal input end of the gate line 40 is larger than an overlapping area between a common electrode and a pixel electrode of each subpixel unit 20 (i.e., subpixel unit B) in the group of subpixel units away from the signal input end of the gate line 40.

In this embodiment, a gate driver 50 is arranged at a side of the array substrate, the plurality of gate lines 40 is connected to the gate driver 50, and a signal input end of the gate lines 40 is arranged adjacent to the gate driver 50. Each gate line 40 is connected to a gate electrode of a TFT corresponding to the subpixel unit 20.

The signal attenuation occurring for the subpixel units A adjacent to the signal input end of the gate line 40 is relatively small, so these subpixel units A may actually be charged for a long time period. In the embodiments of the present disclosure, a large overlapping area is set between the common electrode and the pixel electrode of each subpixel unit A adjacent to the signal input end, so as to form a storage capacitor with a large capacitance. In addition, the signal attenuation occurring for the subpixel units B away from the signal input end of the gate line 40 is relatively large, so these subpixel units B may actually be charged for a short time period. In the embodiments of the present disclosure, a small overlapping area is set between the common electrode and the pixel electrode of each subpixel unit B away from the signal input end, so as to form a storage capacitor with a small capacitance. As a result, it is able to solve the problem in the related art where it is difficult to charge a large-size display panel in an even manner.

Third Embodiment

Figure 3:
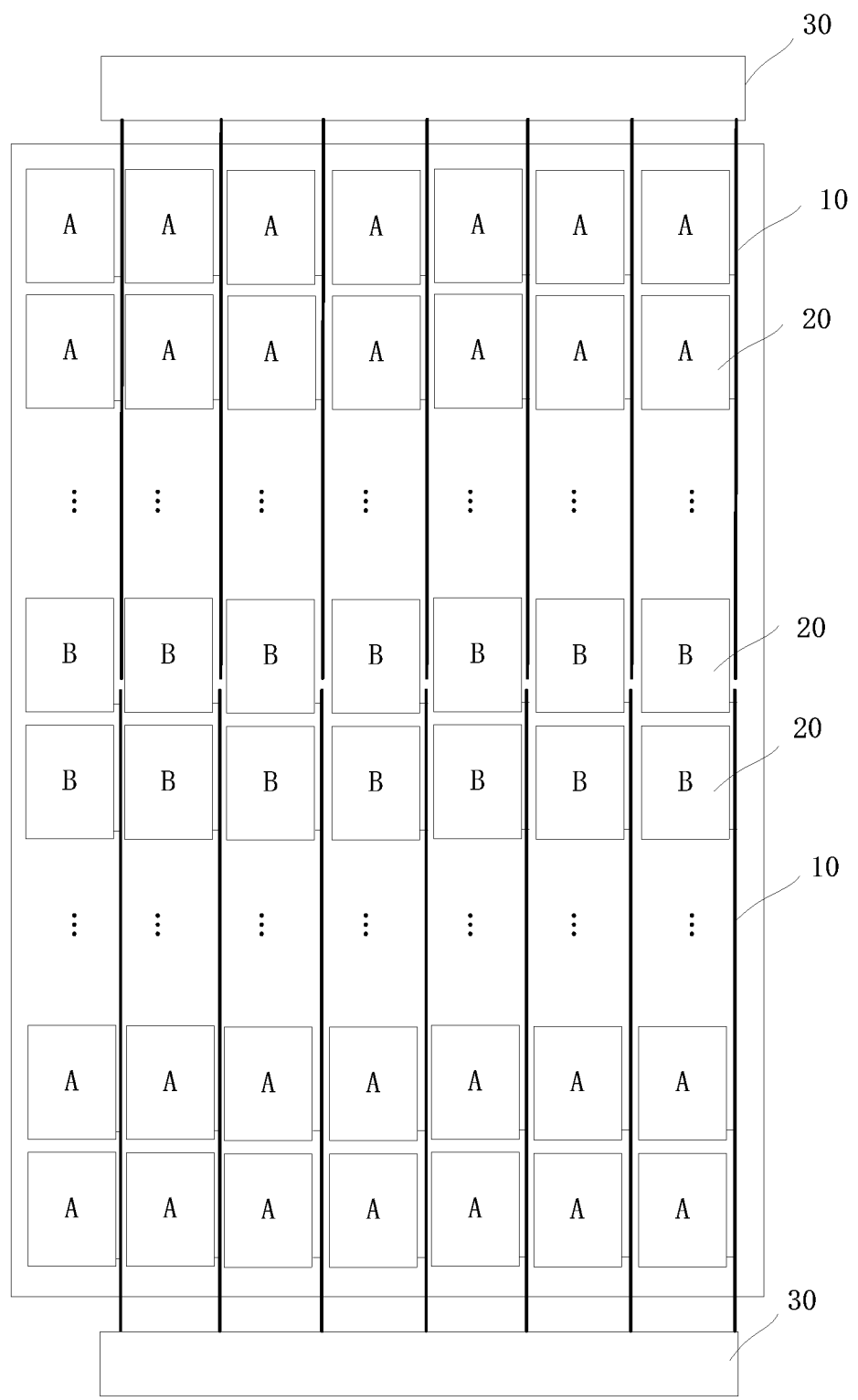
FIG. 3 is a schematic view showing an array substrate according to a third embodiment of the present disclosure.

As shown in FIG. 3, the array substrate includes a plurality of data lines 10, each data line 10 is connected to a plurality of subpixel units 20. The plurality of subpixel units 20 connected to each data line 10 is divided into two groups (in FIG. 3, the subpixel units A connected to the data line 10 belong to one group, and the subpixel units B connected to the data line 10 belong to another group), and each group includes a plurality of subpixel units 20. An overlapping area between a common electrode and a pixel electrode of each subpixel unit 20 (i.e., subpixel unit A) in the group of subpixel units adjacent to a signal input end of the data line 10 is larger than an overlapping area between a common electrode and a pixel electrode of each subpixel unit 20 (i.e., subpixel unit B) in the group of subpixel units away from the signal input end of the data line 10.

In this embodiment, source drivers 30 are arranged at two sides of the array substrate respectively. The data lines 10 at an upper half region are connected to the source driver 30 at an upper side of the array substrate, and the data lines 10 at a lower half region are connected to the source driver 30 at a lower side of the array substrate. An end of the data lines 10 adjacent to the source driver 30 is the signal input end. Each data line 10 is connected to a pixel electrode of the corresponding subpixel unit 20 via a source electrode of a TFT corresponding to the subpixel unit 20.

The signal attenuation occurring for the subpixel units A adjacent to the signal input end of the data line 10 is relatively small, so these subpixel units A may actually be charged for a long time period. In the embodiments of the present disclosure, a large overlapping area is set between the common electrode and the pixel electrode of each subpixel unit A adjacent to the signal input end, so as to form a storage capacitor with a large capacitance. In addition, the signal attenuation occurring for the subpixel units B away from the signal input end of the data line 10 is relatively large, so these subpixel units B may actually be charged for a short time period. In the embodiments of the present disclosure, a small overlapping area is provided between the common electrode and the pixel electrode of each subpixel unit B away from the signal input end, so as to form a storage capacitor with a small capacitance. As a result, it is able to solve the problem in the related art where it is difficult to charge a large-size display panel in an even manner.

Fourth Embodiment

Figure 4:
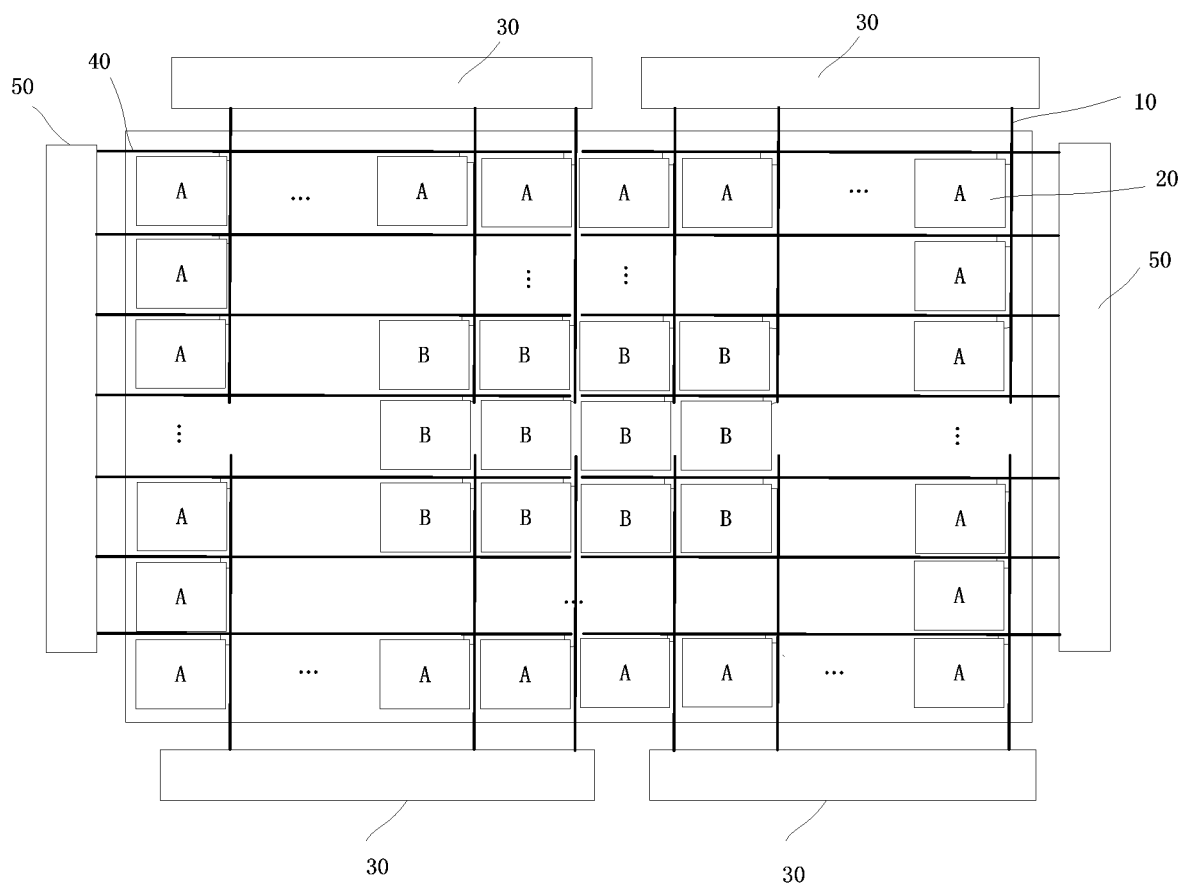
FIG. 4 is a schematic view showing an array substrate according to a fourth embodiment of the present disclosure.

As shown in FIG. 4, the array substrate includes a plurality of data lines 10, a plurality of gate lines 40, and a plurality of subpixel units 20 arranged at regions defined by the data lines 10 and the gate lines 40. In this embodiment, gate drivers 50 are arranged at left and right sides of the array substrate respectively, and source drivers 30 are arranged at upper and lower sides of the array substrate respectively. The gate lines 40 at a left half region are connected to the gate driver 50 at the left side of the array substrate, the gate lines at a right half region are connected to the gate driver 50 at the right side of the array substrate, the data lines 10 at an upper half region are connected to the source driver 30 at the upper side of the array substrate, and the data lines 10 at a lower half region are connected to the source driver 30 at the lower side of the array substrate.

Each data line 10 is connected a corresponding subpixel unit 20 in such a way that a source electrode of a TFT corresponding to the subpixel unit 20 is connected to a pixel electrode of the corresponding subpixel unit 20, and each gate line 40 is connected to a gate electrode of a TFT corresponding to the subpixel unit 20.

The plurality of data lines 10 include first data lines (corresponding to the above-mentioned first signal lines). The first data lines are data lines at a middle region of the array substrate in a row direction. The plurality of subpixel units 20 connected to each first data line 10 is divided into two groups (in FIG. 4, the subpixel units A connected to the first data line 10 belong to one group, and the subpixel units B connected to the first data line 10 belong to another group), and each group includes a plurality of subpixel units 20. An overlapping area between a common electrode and a pixel electrode of each subpixel unit 20 (i.e., subpixel unit A) in the group of subpixel units adjacent to a signal input end of the first data line 10 is larger than an overlapping area between a common electrode and a pixel electrode of each subpixel unit 20 (i.e., subpixel unit B) in the group of subpixel units away from the signal input end of the first data line 10.

The plurality of gate lines 40 includes first gate lines (corresponding to the above-mentioned first signal lines). The first gate lines are gate lines at a middle region of the array substrate in a column direction. The plurality of subpixel units 20 connected to each first gate line 40 is divided into two groups (in FIG. 4, the subpixel units A connected to the first gate line 40 belong to one group, and the subpixel units B connected to the first gate line 40 belong to another group), and each group includes a plurality of subpixel units 20. An overlapping area between a common electrode and a pixel electrode of each subpixel unit 20 (i.e., subpixel unit A) in the group of subpixel units adjacent to a signal input end of the first gate line 40 is larger than an overlapping area between a common electrode and a pixel electrode of each subpixel unit 20 (i.e., subpixel unit B) in the group of subpixel units away from the signal input end of the first gate line 40.

In a word, the overlapping area between the common electrode and the pixel electrode of each subpixel unit 20 at the middle region of the array substrate is smaller than the overlapping area between the common electrode and the pixel electrode of each subpixel unit 20 at the peripheral region of the array substrate.

In this embodiment, in the row direction, the subpixel units of the data lines 10 at the left and right regions of the array substrate may be arranged in a conventional manner, i.e., these subpixel units 20 may have a same structure, and they may be the subpixel units A. In the column direction, the subpixel units of the gate lines 40 at the upper and lower regions of the array substrate may be arranged in a conventional manner, i.e., these subpixel units 20 may have a same structure, and they may be the subpixel units A.

In this embodiment, for parts of the signal lines (i.e., the gate lines 40 and the data lines 10), a large overlapping area is set between the common electrode and the pixel electrode of each subpixel unit A adjacent to the signal input end of each signal line, so as to form a storage capacitor with a large capacitance. In addition, a small overlapping area is set between the common electrode and the pixel electrode of each subpixel unit B away from the signal input end of each signal line, so as to form a storage capacitor with a small capacitance. As a result, it is able to solve the problem in the related art where it is difficult to charge a large-size display panel in an even manner.

In the embodiments of the present disclosure, various arrangement modes may be adopted so as to enable the overlapping area between the common electrode and the pixel electrode of each subpixel unit in the group of subpixel units adjacent to the signal input end of each first signal line to be larger than the overlapping area between the common electrode and the pixel electrode of each subpixel unit in the group of subpixel units away from the signal input end of the first signal line, and some of them will be described hereinafter.

Figure 5:
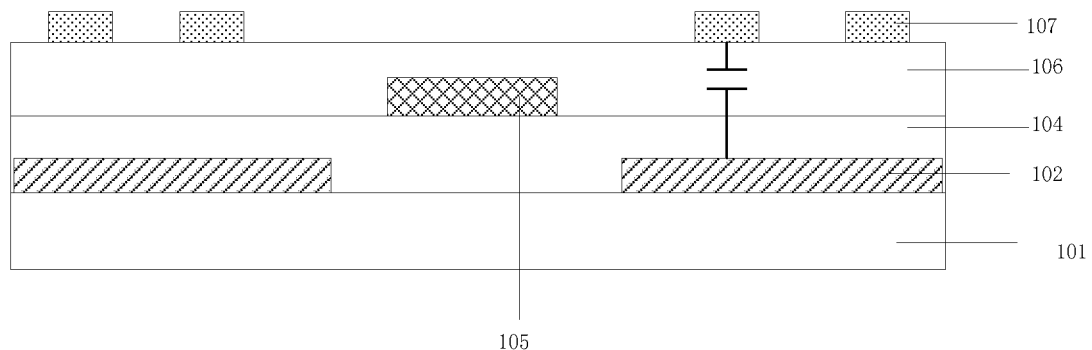
FIG. 5 is a schematic view showing a subpixel unit on the array substrate according to one embodiment of the present disclosure.
Figure 6:
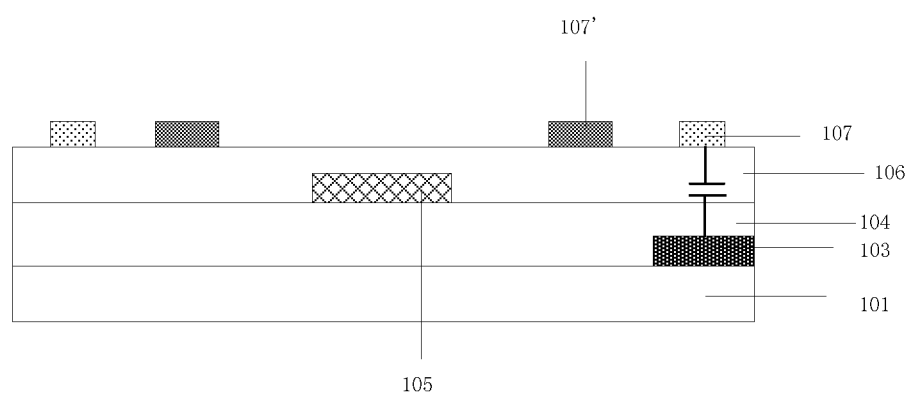
FIG. 6 is another schematic view showing the subpixel unit on the array substrate according to one embodiment of the present disclosure.

In a possible embodiment of the present disclosure, the at least two groups of subpixel units corresponding to each first signal line includes a first group of subpixel unit adjacent to the signal input end of the first signal line and a second group of subpixel units away from the signal input end of the first signal line. FIG. 5 shows a structure of each subpixel unit (i.e., subpixel unit A) in the first group. To be specific, the subpixel unit in the first group includes a transparent pixel electrode 107 and a transparent common electrode 102 arranged at a layer different from the pixel electrode 107. A storage capacitor is formed by the pixel electrode 107 and the common electrode 102 of each subpixel unit A. FIG. 6 shows a structure of each subpixel unit (i.e., subpixel unit B) in the second group. To be specific, the subpixel unit in the second group includes a transparent pixel electrode 107, a transparent common electrode 107' arranged at a layer same as the pixel electrode 107, and a nontransparent common electrode line 103 arranged at a layer different from the pixel electrode 107. A storage capacitor is formed by the pixel electrode 107 and the common electrode line 103 of each subpixel unit B. In FIGS. 5 and 6, 101 represents a base substrate, 104 represents a gate insulation layer, 105 represents a source-drain metal layer pattern, and 106 represents a passivation layer. As shown in FIGS. 5 and 6, an overlapping area between the pixel electrode 107 and the common electrode 102 of each subpixel unit A in the first group of subpixel units adjacent to the signal input end of the first signal line is obviously greater than an overlapping area between the pixel electrode 107 and the common electrode line 103 (which is a part of the entire common electrode and has a relatively small width) of each subpixel unit B in the second group of subpixel units away from the signal input end of the first signal line.

In a possible embodiment of the present disclosure, the common electrode 102 of each subpixel unit A in the first group of subpixel units is of a plate-like shape, the pixel electrode 107 of each subpixel unit A in the first group of subpixel units is of a comb-like shape (as shown in FIG. 5), and the pixel electrode 107 and the common electrode 107' of each subpixel unit B in the second group of subpixel units are each of a comb-like shape, and the pixel electrode 107 of the subpixel unit in the second group of subpixel units interdigitates with the common electrode 107' of the subpixel unit in the second group of subpixel units by a distance.

As shown in FIGS. 7 to 10, the array substrate in the embodiments of the present disclosure may be manufactured as follows.

Figure 7:
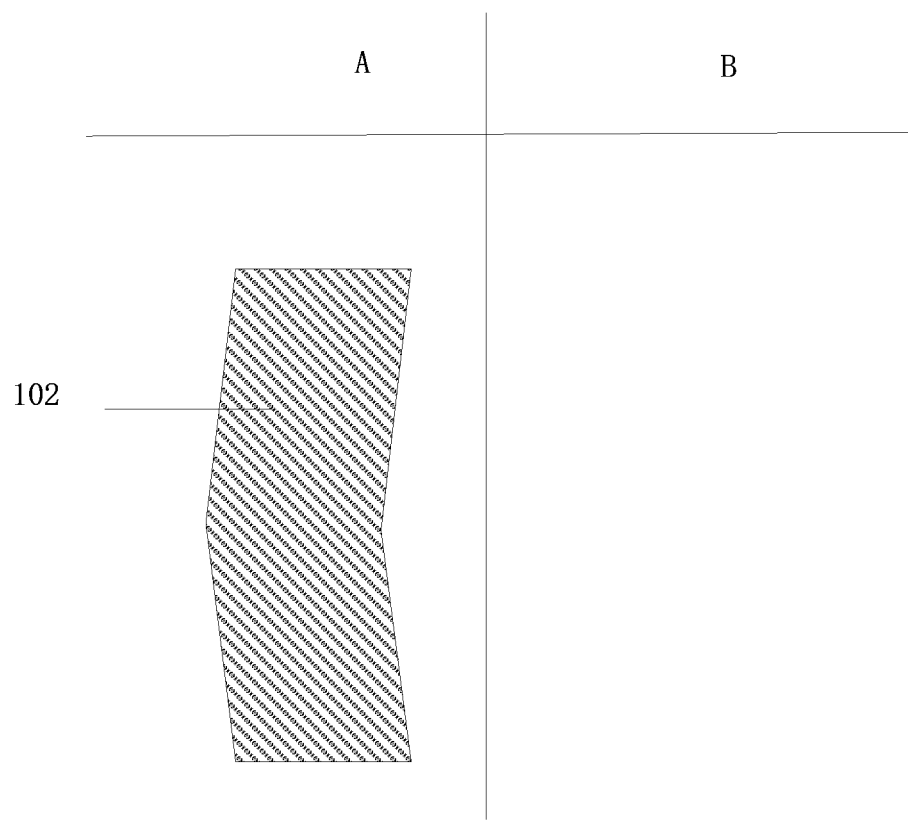
FIGS. 7-10 are schematic views showing a method of manufacturing the array substrate in FIGS. 5 and 6.

Step 1: referring to FIGS. 7, 5 and 6, the common electrodes 102 of the subpixel units A in the first group are formed on the base substrate 101, and it is unnecessary to form the common electrodes of the subpixel units B in the second group. Each common electrode 102 is a transparent common electrode made of Indium Tin Oxide (ITO).

Figure 8:
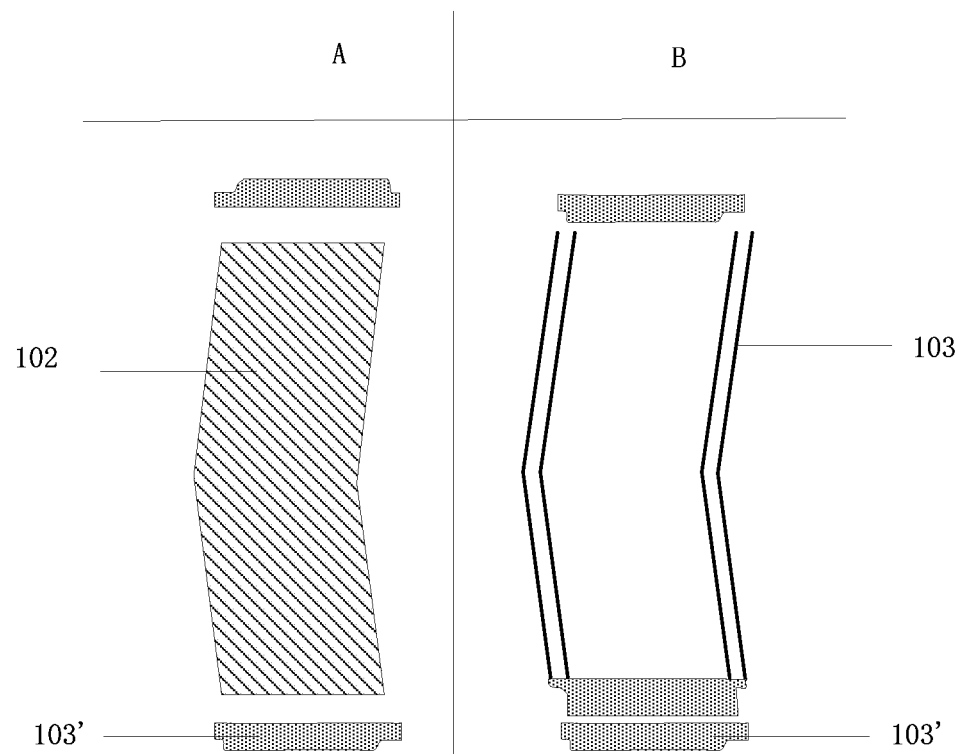

Step 2: referring to FIGS. 8, 5 and 6, a pattern of a gate metal layer is formed. The gate metal layer includes gate electrodes 103' of the subpixel units A, gate electrodes 103' of subpixel units B, and the common electrode lines 103 of the subpixel units B.

Step 3: referring to FIGS. 5 and 6, the gate insulation layer 104 is formed.

Step 4: a pattern of an active layer of each of the subpixel units A and the subpixel units B is formed.

Figure 9:
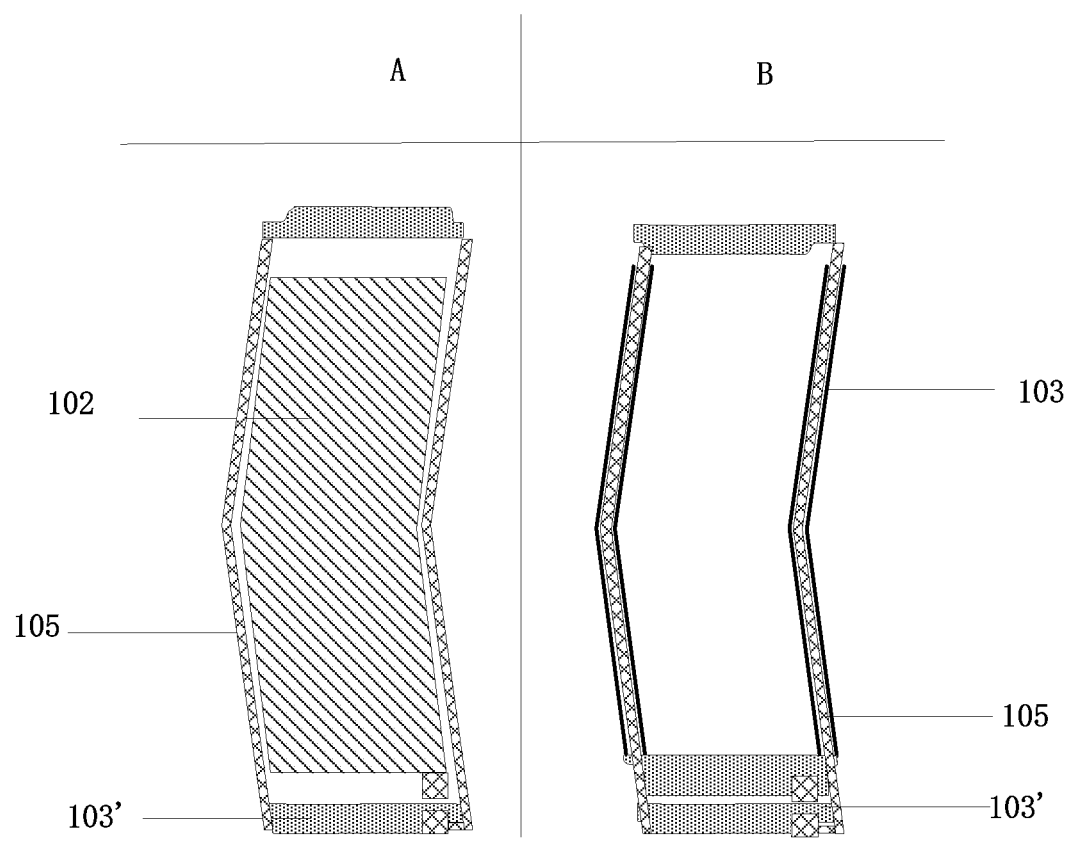

Step 5: referring to FIGS. 9, 5 and 6, a pattern of a source-drain metal layer 105 is formed. The pattern of the source-drain metal layer includes data lines, source electrodes and drain electrodes of the subpixel units A, and source electrodes and drain electrodes of the subpixel units B.

Step 6: referring to FIGS. 5 and 6, the passivation layer 106 is formed, and a via-hole is formed in the passivation layer 106.

Figure 10:
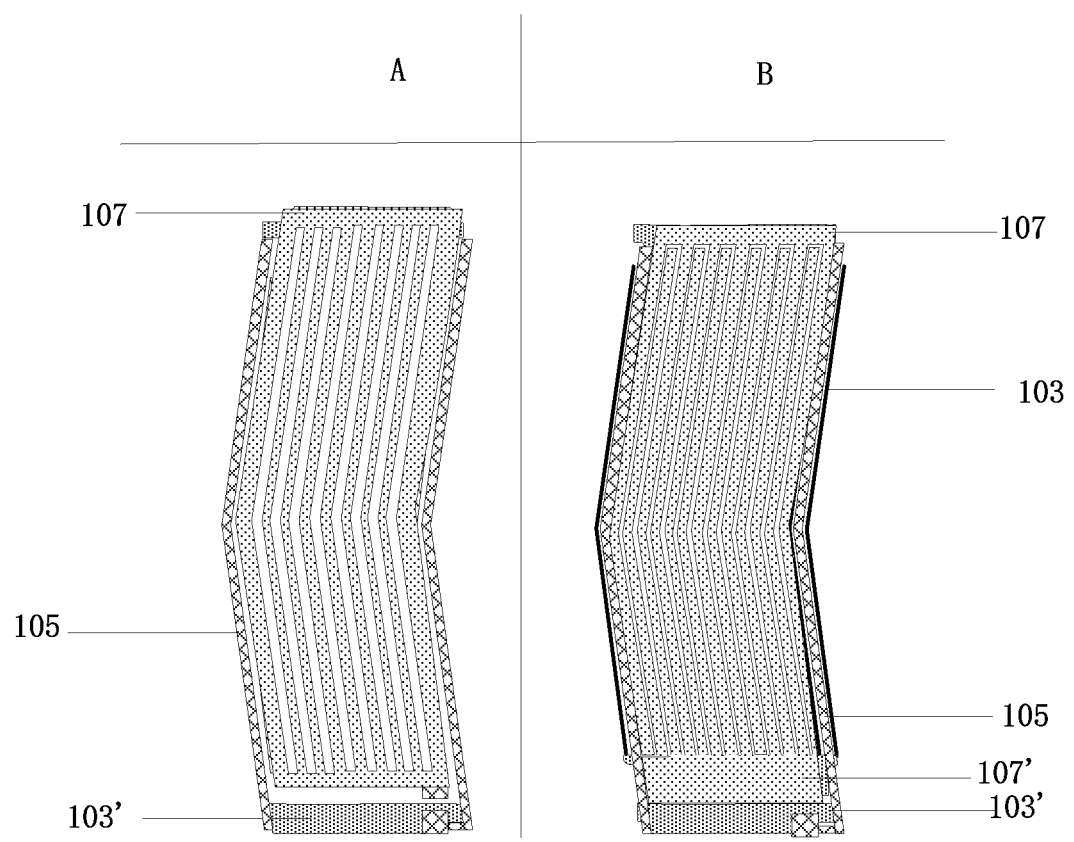

Step 7: referring to FIGS. 10, 5 and 6, the pixel electrodes 107 of the subpixel units A, and the pixel electrodes 107 and the common electrodes 107' of the subpixel units B are formed.

In a possible embodiment of the present disclosure, each subpixel unit in the at least two groups of subpixel units of each first signal line includes a transparent pixel electrode and a transparent common electrode arranged at a layer different from the transparent pixel electrode, the pixel electrodes of the subpixel units in the at least two groups of subpixel units have a same size, and the common electrodes of the subpixel units in the at least two groups of subpixel units have sizes gradually decreasing in a direction away from the signal input end of the first signal line. In this way, the overlapping areas between the common electrodes and the pixel electrodes of the subpixel units in the at least two groups decrease gradually in the direction away from the signal input end of the first signal line.

In a possible embodiment of the present disclosure, the at least two groups of subpixel units corresponding to each first signal line include a first group of subpixel units arranged adjacent to the signal input end of the first signal line and a second group of subpixel units arranged away from the signal input end of the first signal line, the common electrode of each subpixel unit in the first group of subpixel units is of a plate-like shape, and the common electrode of each subpixel unit in the second group of subpixel units is of a comb-like shape.

Of course, in some other possible embodiments of the present disclosure, any other arrangement mode may be adopted, so as to enable the overlapping area between the common electrode and the pixel electrode of each subpixel unit in the group of subpixel units adjacent to the signal input end of the first signal line to be greater than the overlapping area between the common electrode and the pixel electrode of each subpixel unit in the group of subpixel units away from the signal input end of the first signal line, which will not be particularly defined herein.

The present disclosure further provides in some embodiments a display panel including the above-mentioned array substrate.

The present disclosure further provides in some embodiments a display device including the above-mentioned array substrate and a driving unit connected to a signal input end of signal lines on the array substrate.

In a possible embodiment of the present disclosure, the signal lines are gate lines or data lines, and the driving unit is arranged at one side or two opposite sides of the array substrate. A plurality of subpixel units connected to each first signal line is divided into at least two groups of subpixel units, and overlapping areas between common electrodes and pixel electrodes of the subpixel units gradually decrease in a direction away from the driving unit.

In a possible embodiment of the present disclosure, the signal lines include gate lines and data lines, and the driving unit includes gate driving units arranged at two opposite sides of the array substrate and source driving units arranged at two other opposite sides of the array substrate. An overlapping area between a common electrode and a pixel electrode of each subpixel unit at a middle region of the array substrate is smaller than an overlapping area between a common electrode and a pixel electrode of each subpixel unit at a peripheral region of the array substrate.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a plurality of signal lines, wherein each signal line is connected to a plurality of subpixel units, the plurality of signal lines comprises first signal lines;
the plurality of subpixel units connected to each first signal line is divided into at least two groups of subpixel units, each group of subpixel units comprises at least one subpixel unit; and
an overlapping area between a common electrode and a pixel electrode of each subpixel unit in a group of subpixel units adjacent to a signal input end of the first signal line is larger than an overlapping area between a common electrode and a pixel electrode of each subpixel unit in a group of subpixel units away from the signal input end of the first signal line,
wherein the at least two groups of subpixel units corresponding to the first signal line comprise a first group of subpixel units arranged adjacent to the signal input end of the first signal line and a second group of subpixel units arranged away from the signal input end of the first signal line;
each subpixel unit in the first group of subpixel units comprises a transparent pixel electrode and a transparent common electrode arranged at a layer different from the pixel electrode, and a storage capacitor is formed between the pixel electrode and the common electrode of the subpixel unit in the first group of subpixel units; and
each subpixel unit in the second group of subpixel units comprises a transparent pixel electrode, a transparent common electrode arranged at a layer same as the pixel electrode and a nontransparent common electrode line arranged at a layer different from the pixel electrode, and a storage capacitor is formed between the pixel electrode and the common electrode line of the subpixel unit in the second group of subpixel units.

2. The array substrate according to claim 1, wherein the signal lines comprise at least one of gate lines or data lines.

3. The array substrate according to claim 2, wherein each subpixel unit in the at least two groups of subpixel units corresponding to each first signal line comprises a transparent pixel electrode and a transparent common electrode arranged at a layer different from the transparent pixel electrode, the pixel electrodes of the subpixel units in the at least two groups of subpixel units have a same size, and sizes of the common electrodes of the subpixel units in the at least two groups of subpixel units gradually decrease in a direction away from the signal input end of the first signal line.

4. The array substrate according to claim 1, wherein the common electrode of the subpixel unit in the first group of subpixel units is of a plate-like shape, the pixel electrode of each subpixel unit in the first group of subpixel units is of a comb-like shape, and the pixel electrode and the common electrode of the subpixel unit in the second group of subpixel units are each of a comb-like shape, and the pixel electrode of the subpixel unit in the second group of subpixel units interdigitates with the common electrode of the subpixel unit in the second group of subpixel units by a distance.

5. The array substrate according to claim 1, wherein each subpixel unit in the at least two groups of subpixel units corresponding to each first signal line comprises a transparent pixel electrode and a transparent common electrode arranged at a layer different from the transparent pixel electrode, the pixel electrodes of the subpixel units in the at least two groups of subpixel units have a same size, and sizes of the common electrodes of the subpixel units in the at least two groups of subpixel units gradually decrease in a direction away from the signal input end of the first signal line.

6. The array substrate according to claim 1, further comprising a base substrate, wherein the plurality of signal lines is arranged on the base substrate.

7. The array substrate according to claim 6, wherein the overlapping area between the common electrode and the pixel electrode of each subpixel unit in the group of subpixel units adjacent to the signal input end of the first signal line is an overlapping area between the common electrode and the pixel electrode of each subpixel unit in the group of subpixel units adjacent to the signal input end of the first signal line projected in a direction perpendicular to the base substrate, and the overlapping area between the common electrode and the pixel electrode of each subpixel unit in the group of subpixel units away from the signal input end of the first signal line is an overlapping area between the common electrode and the pixel electrode of each subpixel unit in the group of subpixel units away from the signal input end of the first signal line projected in the direction perpendicular to the base substrate.

8. A display panel, comprising the array substrate according to claim 1.

9. A display device, comprising the array substrate according to claim 1, and a driving unit connected to signal input ends of signal lines on the array substrate.

10. The display device according to claim 9, wherein the signal lines are gate lines or data lines, and the driving unit is arranged at one side or two opposite sides of the array substrate;
a plurality of subpixel units connected to each first signal line is divided into at least two groups of subpixel units; and
overlapping areas between common electrodes and pixel electrodes of the subpixel units gradually decrease in a direction away from the driving unit.

11. The display device according to claim 9, wherein the signal lines comprises gate lines and data lines, and the driving unit comprises a gate driving unit arranged at two opposite sides of the array substrate and a source driving unit arranged at two other opposite sides of the array substrate;
a plurality of subpixel units connected to each first signal line is divided into at least two groups of subpixel units; and
an overlapping area between a common electrode and a pixel electrode of each subpixel unit at a middle region of the array substrate is smaller than an overlapping area between a common electrode and a pixel electrode of each subpixel unit at a peripheral region of the array substrate.

12. An array substrate, comprising a plurality of signal lines, wherein each signal line is connected to a plurality of subpixel units, the plurality of signal lines comprises first signal lines;
the plurality of subpixel units connected to each first signal line is divided into at least two groups of subpixel units, each group of subpixel units comprises at least one subpixel unit;
an overlapping area between a common electrode and a pixel electrode of each subpixel unit in a group of subpixel units adjacent to a signal input end of the first signal line is larger than an overlapping area between a common electrode and a pixel electrode of each subpixel unit in a group of subpixel units away from the signal input end of the first signal line;

each subpixel unit in the at least two groups of subpixel units corresponding to each first signal line comprises a transparent pixel electrode and a transparent common electrode arranged at a layer different from the transparent pixel electrode, the pixel electrodes of the subpixel units in the at least two groups of subpixel units have a same size, and sizes of the common electrodes of the subpixel units in the at least two groups of subpixel units gradually decrease in a direction away from the signal input end of the first signal line;

the at least two groups of subpixel units corresponding to each first signal line comprises a first group of subpixel units arranged adjacent to the signal input end of the first signal line and a second group of subpixel units arranged away from the signal input end of the first signal line, the common electrode of the subpixel unit in the first group of subpixel units is of a plate-like shape, and the pixel electrode of each subpixel unit in the second group of subpixel units is of a comb-like shape.

13. An array substrate, comprising a plurality of signal lines each connected to a plurality of subpixel units, wherein the plurality of signal lines comprises first signal lines;

the plurality of subpixel units connected to each first signal line is divided into at least two groups of subpixel units, each group of subpixel units includes at least one subpixel unit; and a capacitance of a storage capacitor formed between a common electrode and a pixel electrode of each subpixel unit in a group of subpixel units adjacent to a signal input end of the first signal line is larger than a capacitance of a storage capacitor formed between a common electrode and a pixel electrode of each subpixel unit in a group of subpixel units away from the signal input end of the first signal line, wherein the at least two groups of subpixel units corresponding to each first signal line comprise a first group of subpixel units arranged adjacent to the signal input end of the first signal line and a second group of subpixel units arranged away from the signal input end of the first signal line;

each subpixel unit in the first group of subpixel units comprises a transparent pixel electrode and a transparent common electrode arranged at a layer different from the pixel electrode, and a first storage capacitor is formed between the pixel electrode and the common electrode of the subpixel unit in the first group of subpixel units;

each subpixel unit in the second group of subpixel units comprises a transparent pixel electrode, a transparent common electrode arranged at a layer same as the pixel electrode and a nontransparent common electrode line arranged at a layer different from the pixel electrode, a second storage capacitor is formed between the pixel electrode and the common electrode line of the subpixel unit in the second group of subpixel units; and the first storage capacitor has a capacitance greater than that of the second storage capacitor.

\* \* \* \* \*